United States Patent
Tews et al.

(10) Patent No.: US 6,656,798 B2
(45) Date of Patent: Dec. 2, 2003

(54) GATE PROCESSING METHOD WITH REDUCED GATE OXIDE CORNER AND EDGE THINNING

(75) Inventors: Helmut Tews, Unterhaching (DE); Oleg Gluschenkov, Wappingers Falls, NY (US); Mary Weybright, Pleasant Valley, NY (US)

(73) Assignee: Infineon Technologies, AG, Munich (DE)

( * ) Notice: Subject to any disclaimer, the term of this patent is extended or adjusted under 35 U.S.C. 154(b) by 56 days.

(21) Appl. No.: 09/965,919

(22) Filed: Sep. 28, 2001

(65) Prior Publication Data

US 2003/0067035 A1 Apr. 10, 2003

(51) Int. Cl.$^7$ ............................................. H01L 21/336
(52) U.S. Cl. ...................... 438/270; 438/294; 438/296; 438/424; 438/585; 257/333
(58) Field of Search .................. 257/333; 438/270, 438/241, 199, 424, 585, 433, 294, 296, 426, 435

(56) References Cited

U.S. PATENT DOCUMENTS

| | | | | |
|---|---|---|---|---|
| 6,087,243 A | * | 7/2000 | Wang .......................... | 438/424 |
| 6,309,924 B1 | * | 10/2001 | Divakaruni et al. ........ | 438/243 |
| 6,342,431 B2 | * | 1/2002 | Houlihan et al. ........... | 438/433 |
| 6,391,720 B1 | * | 5/2002 | Sneelal et al. .............. | 438/259 |
| 6,437,381 B1 | * | 8/2002 | Gruening et al. ........... | 257/296 |

* cited by examiner

Primary Examiner—David Nelms
Assistant Examiner—Andy Huynh

(57) ABSTRACT

Disclosed is a method of processing a semiconductor gate structure on a semiconductor wafer, the method comprising providing a semiconductor structure with an active device area capped with a pad oxide layer bounded by one or more isolation trenches, providing a sacrificial oxide layer by thickening said pad oxide layer to a desired oxide thickness, in using said thickened pad oxide layer as said sacrificial oxide layer for device implantation, stripping said sacrificial pad oxide layer after use, and capping said semiconductor gate with a final gate oxide layer.

8 Claims, 7 Drawing Sheets

GATE PROCESSING METHOD WITH REDUCED GATE OXIDE CORNER AND EDGE THINNING

FIELD OF THE INVENTION

This invention relates generally to the manufacture of semiconductor gates, more specifically to the reduction of oxide thinning at the corners and edges of gate oxides.

BACKGROUND OF THE INVENTION

Gate oxide reliability is often limited by gate oxide thinning at the STI (shallow trench isolation) edges and corners. The reason for this effect is the insufficient STI corner rounding during AA oxidation and the orientation-dependent and stress-induced gate oxidation around these edges. The typical prior art process is shown in FIGS. 1a through 1e.

Referring to FIG. 1a, we see a gate structure 1 comprising a pad oxide layer, sandwiched between a pad nitride layer 3 and a silicon substrate 4.

Referring to FIG. 1b, we see that the pad nitride layer 3 is pulled back. Typical values of the pad nitride pullback are from 0 to 30 nm. The nitride pullback is done by using selective wet chemical etch of the pad nitride.

Referring to FIG. 1c, the next steps in the processing are the oxidation of the exposed silicon (active area, or "AA", oxidation) and an STI fill with a dielectric, usually oxide.

Referring to FIG. 1d, the pad nitride 3 is then stripped. This strip is selected to the oxide 5, although it etches a small part of it. Typical etch selectivities are 1 to 50. For 100 nm of nitride that gives 2 nm of sideways oxide etch. This is followed by an etch of the pad oxide 2. With some overetch, this etch also extends sideways into the STI isolation oxide 5. For a typical pad oxide thickness of 5 nm, this gives a sideways etch of 5 to 7 nm. The pad oxide etch is followed by sacrificial oxidation to create a thin oxide with well-defined thickness and uniformity. This oxide is needed as a screen oxide for implants.

The situation at this point is depicted in FIG. 1d. The thickness of the sacrificial oxide 6 is typically 5 nm to 10 nm.

Referring to FIG. 1e, after the implants, the sacrificial oxide is stripped using wet chemical oxide etch selective to nitride. Again using a slight overetch, approximately 10 nm of oxide are etched sideways into the STI. This sideways etch is sometimes even larger depending on the densification of the oxide used for the STI fill. This step leads to the exposure of the STI edge. In the following gate oxidation, the gate oxide 7 is usually thinner at the edges, especially the corners, as compared to the center. The reason is believed to be the orientation dependent oxidation rate and, to a larger extent, mechanical stress.

SUMMARY OF THE INVENTION

Disclosed is a method of processing a semiconductor gate structure on a semiconductor wafer, the method comprising providing a semiconductor structure comprising a semiconductor gate capped with a pad oxide layer bounded by one or more isolation trenches filled with silicon oxide, providing a sacrificial oxide layer by thickening said pad oxide layer to a thickness effective in using said thickened pad oxide layer as said sacrificial oxide layer, stripping said sacrificial pad oxide layer after use, and capping said semiconductor gate with a gate oxide layer.

In another aspect of the invention said thickening step comprises heating said semiconductor wafer in an oxygen-containing atmosphere to a temperature effective in silicon oxide growth.

In another aspect of the invention said semiconductor wafer is heated to a temperature of from about 500° C. to about 1,000° C.

In another aspect of the invention said temperature is about 700° C.

In another aspect of the invention said semiconductor wafer is heated for about one hour.

In another aspect of the invention said sacrificial oxide layer is from about 20 to about 100 angstroms thick.

In another aspect of the invention said sacrificial oxide layer is from about 30 to about 50 angstroms thick.

In another aspect of the invention said sacrificial oxide layer is about 40 angstroms thick.

In another aspect of the invention said sacrificial oxide layer comprises amorphous silicon oxide.

Disclosed is a semiconductor structure comprising a semiconductor gate capped with a sacrificial oxide layer bounded by one or more isolation trenches, and said sacrificial oxide layer comprises amorphous silicon oxide.

In another aspect of the apparatus said sacrificial oxide layer is between about 20 to about 100 angstroms thick.

In another aspect of the apparatus said sacrificial oxide layer is between about 30 to about 50 angstroms thick.

In another aspect of the apparatus said sacrificial oxide layer is about 40 angstroms thick.

DETAILED DESCRIPTION OF PREFERRED EMBODIMENTS

A basic idea of the present invention is to reduce the number of oxide etch steps and therefore avoid the exposure of the STI corners. The basic steps of the invention may be summarized and compared to that described above with respect to the prior art, such as is shown in Table I, below.

TABLE I

| Inventive Method | Prior Art |
| --- | --- |
| 1. STI dry etch through pad nitride, pad oxide, and to a predefined depth into the silicon. | 1. STI dry etch through pad nitride, pad oxide, and to a predefined depth into the silicon. |
| 2. Pad nitride pullback. | 2. Pad nitride pullback. |
| 3. AA oxidation. | 3. AA oxidation. |
| 4. STI oxide fill and planarization. | 4. STI oxide fill and planarization. |
| 5. Pad nitride strip. | 5. Pad nitride strip. |
| 6. Oxidation step to increase the thickness of the remaining pad oxide to the desired sac oxide thickness. | 6. Pad oxide strip. 7. Sacrificial oxide growth. 8. Implants and anneals. |
| 7. Implants and anneals. | 9. Sacrificial oxide strip. |
| 8. Sacrificial oxide strip. | 10. Gate oxidation. |
| 9. Gate oxidation. | |

Figure 1A:
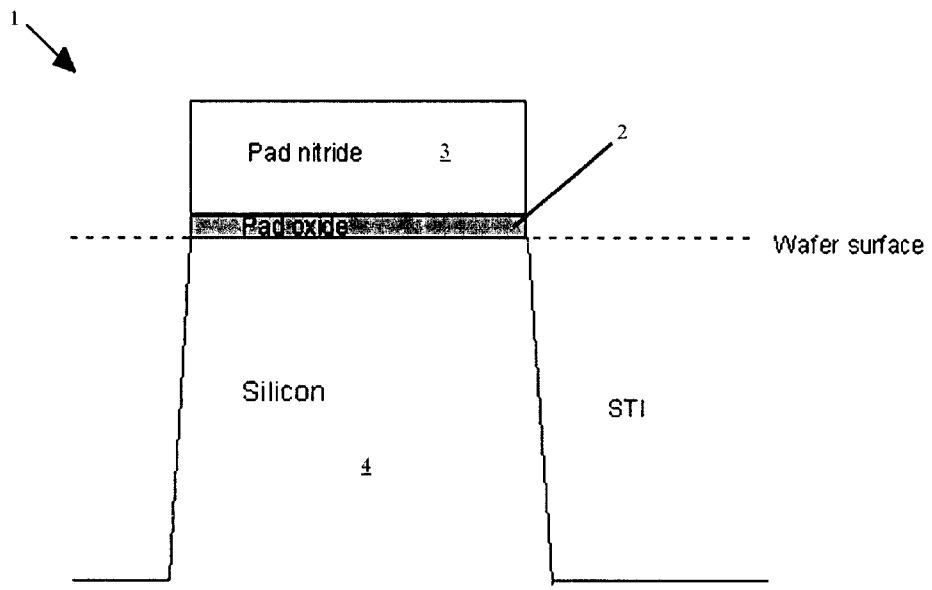
FIGS. 1a through 1e show the typical prior art method of manufacturing a gate.
Figure 1B:
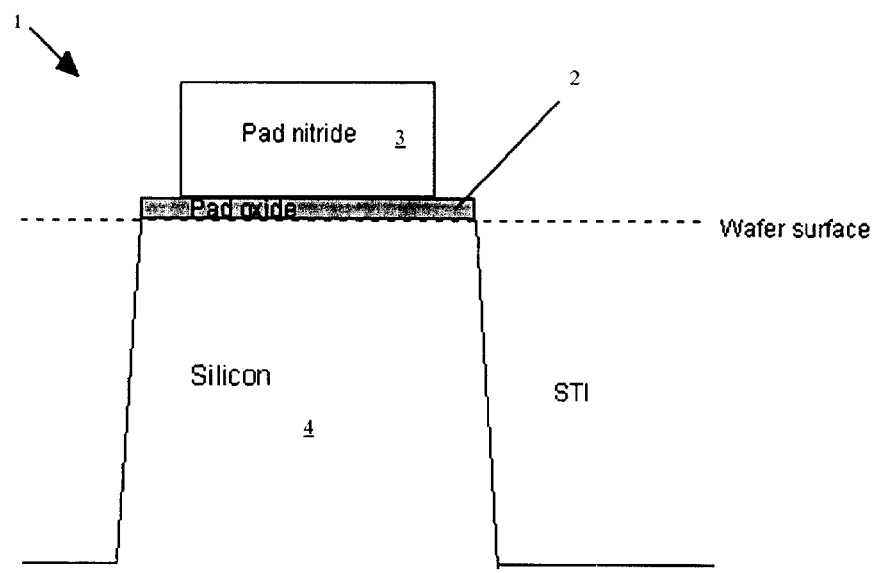
Figure 1C:
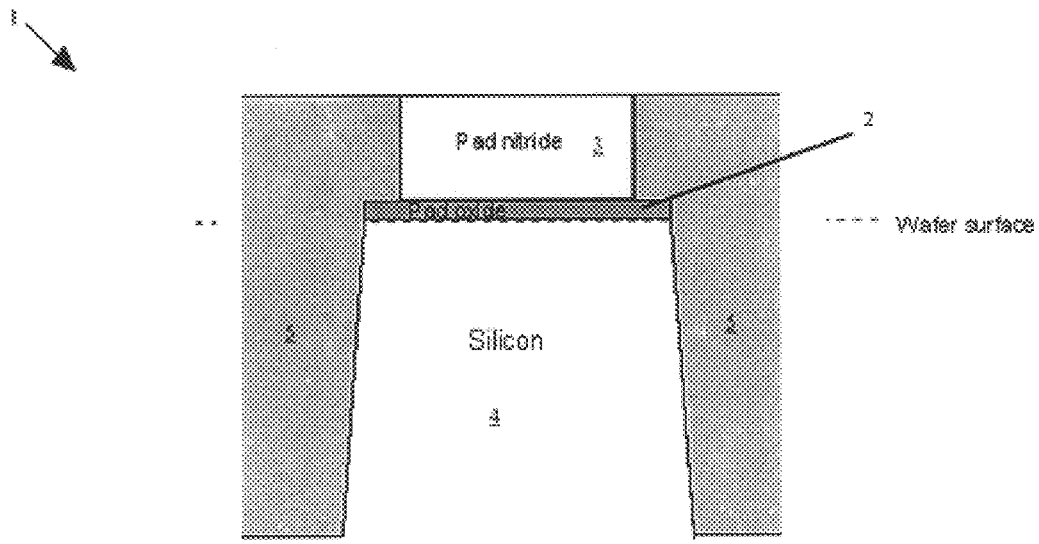
Figure 1D:
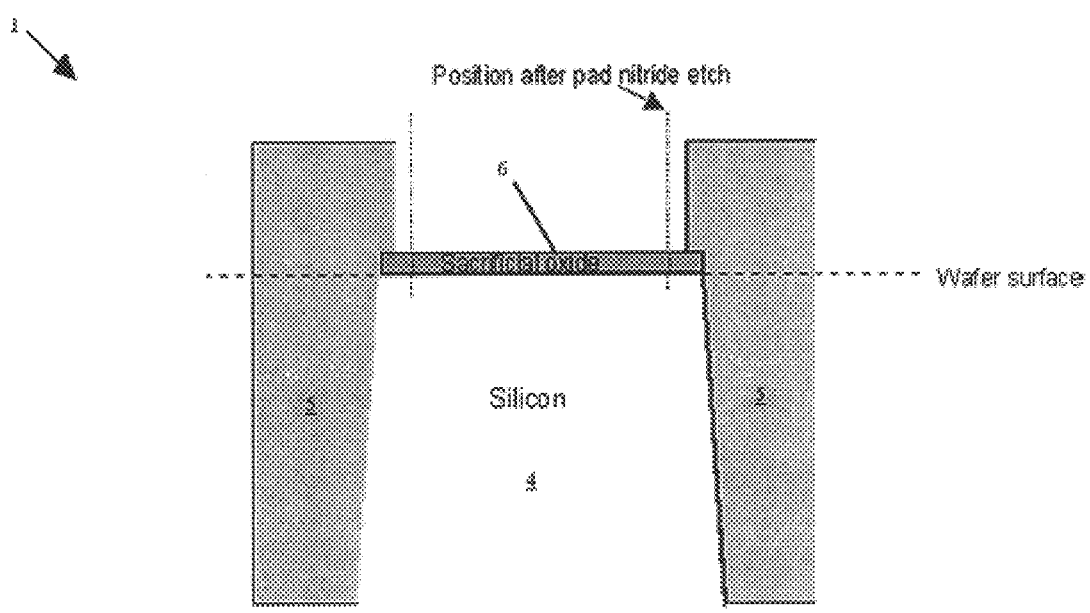
Figure 1E:
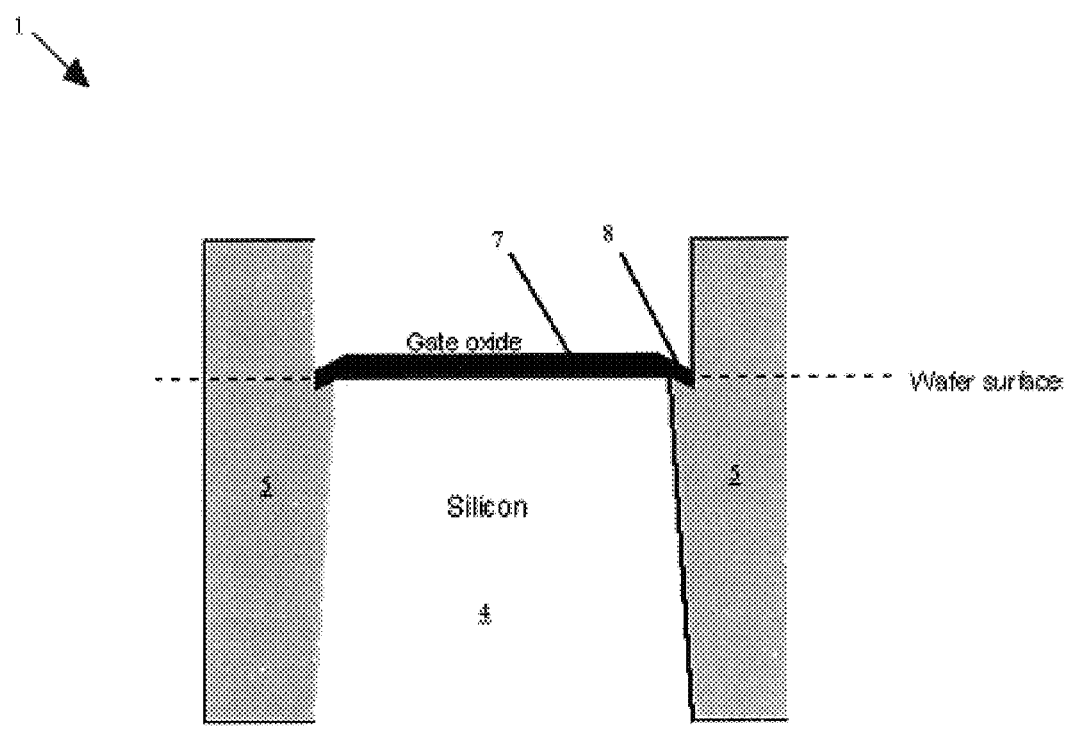

As can be seen, the first five steps of the method of the invention may be substantially identical to that of the prior art. Hence, FIGS. 2a through 2c are depicted identically to FIGS. 1a through 1c, excepting that different numerals are used.

Figure 2A:
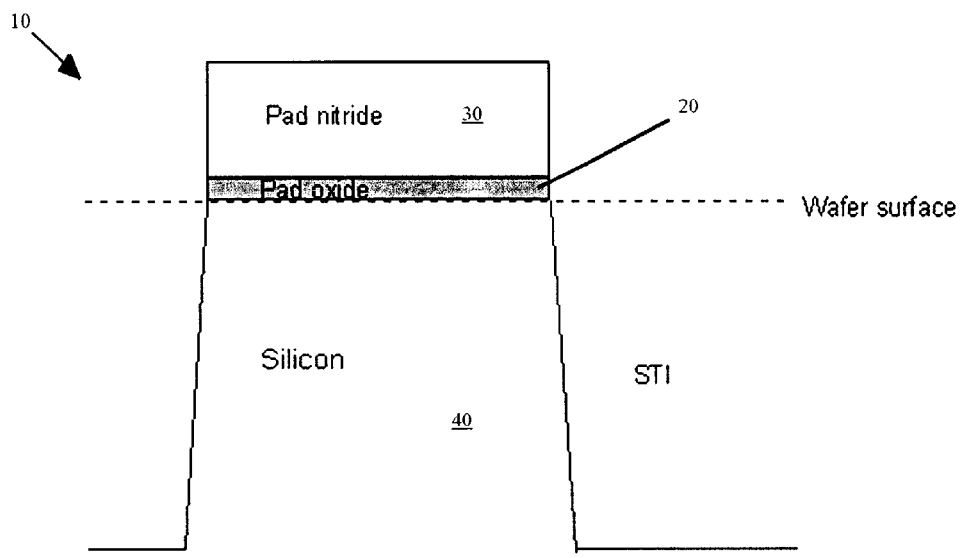
FIGS. 2a through 2f show the inventive method of manufacturing a gate.
Figure 2B:
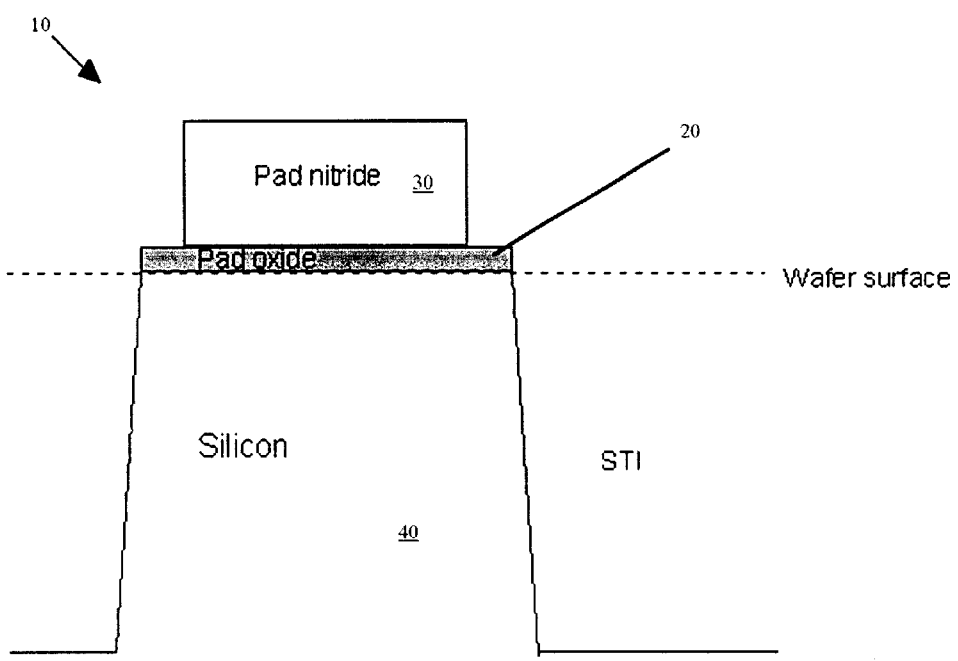
Figure 2C:
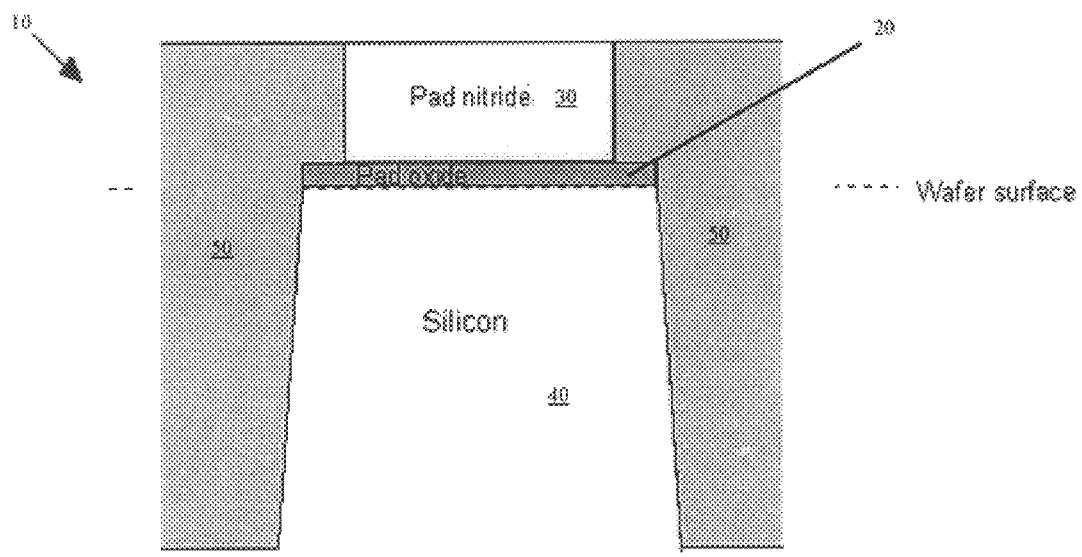

Referring to FIGS. 2a through 2c there is shown a gate structure 10 having a pad oxide layer 20 sandwiched between a pad nitride layer 30 and a silicon substrate 40, isolation trenches on either side of the gate structure 10 having been filled in with oxide 50.

Figure 2D:
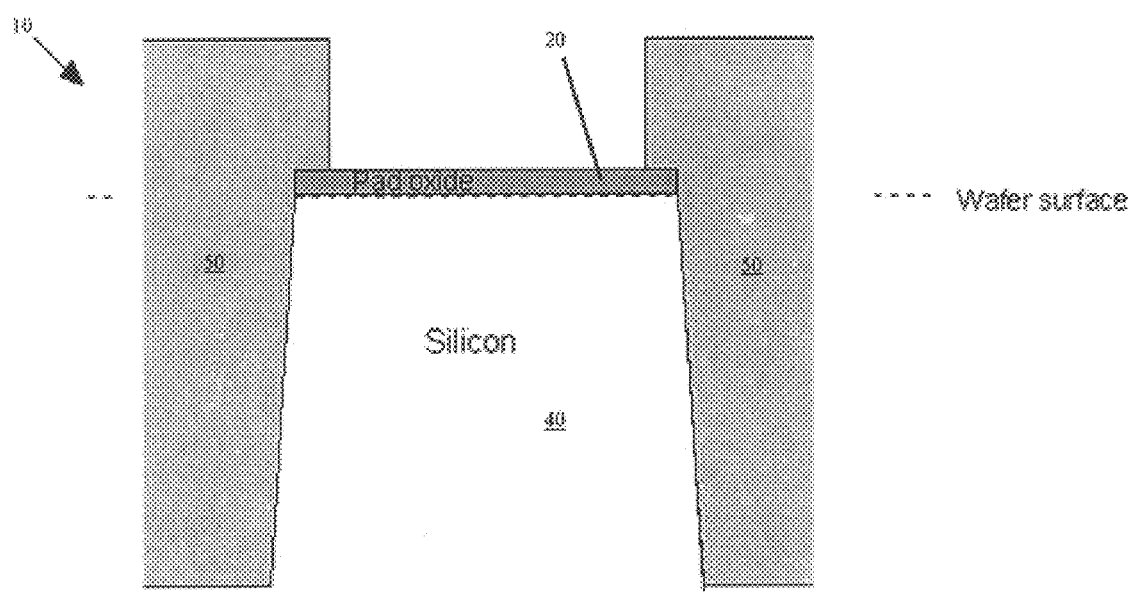

Referring to FIG. 2d it can be seen that the pad nitride has been stripped away, but the pad oxide is left intact, resulting in a basic semiconductor structure comprising a semiconductor gate 10 capped with a pad oxide layer 20 bounded by one or more trench fills 50. Preferred etches for silicon nitride include phosphoric acid ($H_3PO_4$) and sodium hydroxide (NaOH) isotropic wet etches, which are selective with respect to organic polymers, polysilicon, silicon, and metals. These etches are effected by immersing the wafer in an aqueous solution of NaOH or $H_3PO_4$ at temperatures of generally 80° C. or more, preferably 100° C. or more, for ° C. sodium hydroxide etches and generally 150° C. or more, preferably 180° C. or more, for phosphoric acid etches. When performing a phosphoric acid etch, it is desirable to maintain the concentration of etchant in solution with reflux. A number of chemical bath systems are commercially available just for this purpose, such as those sold under the NITRAN brand name by Lufran, Inc., of Streetsboro, Ohio.

At this point we deviate from the art and, rather than strip the oxide and replacing it with a sacrificial oxide, a thickening of the pad oxide layer is instead performed so as to create a sacrificial oxide layer.

Figure 2E:
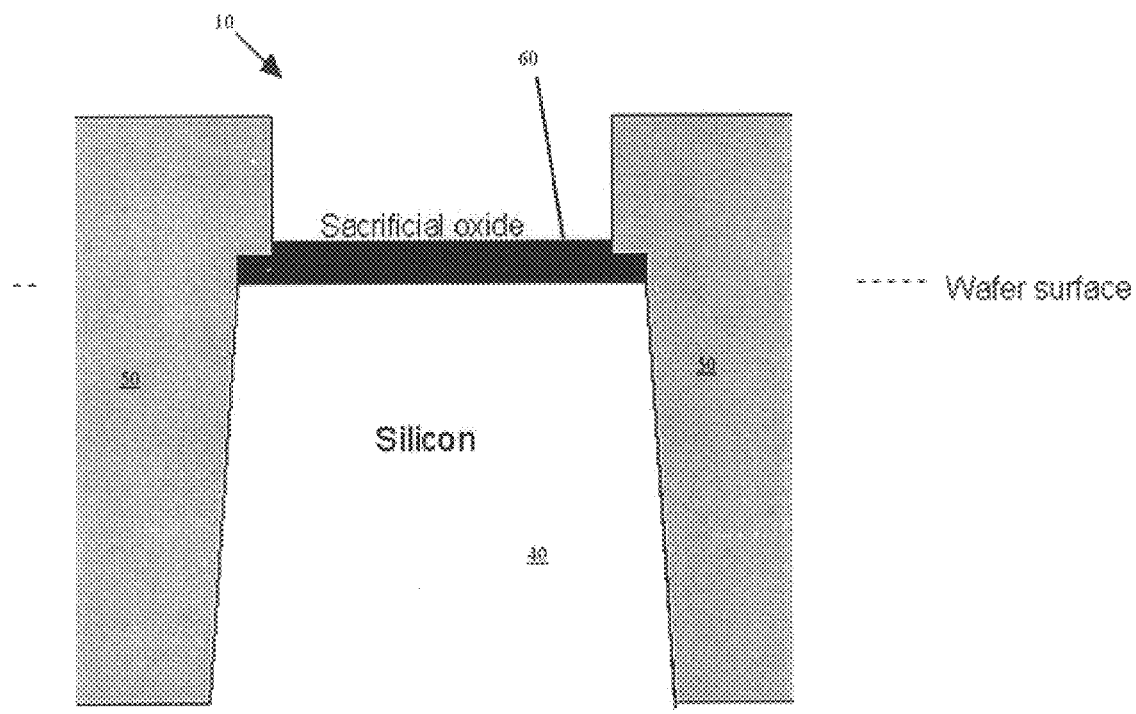

Referring to FIG. 2e, there is now a thick layer of oxide 60 upon the gate substrate 40, which is thick enough to be used as a sacrificial oxide layer 60. The manufacturer may now perform whatever implants and anneals are desired, followed by the stripping of the sacrificial oxide 60 by wet chemical etch.

Figure 2F:
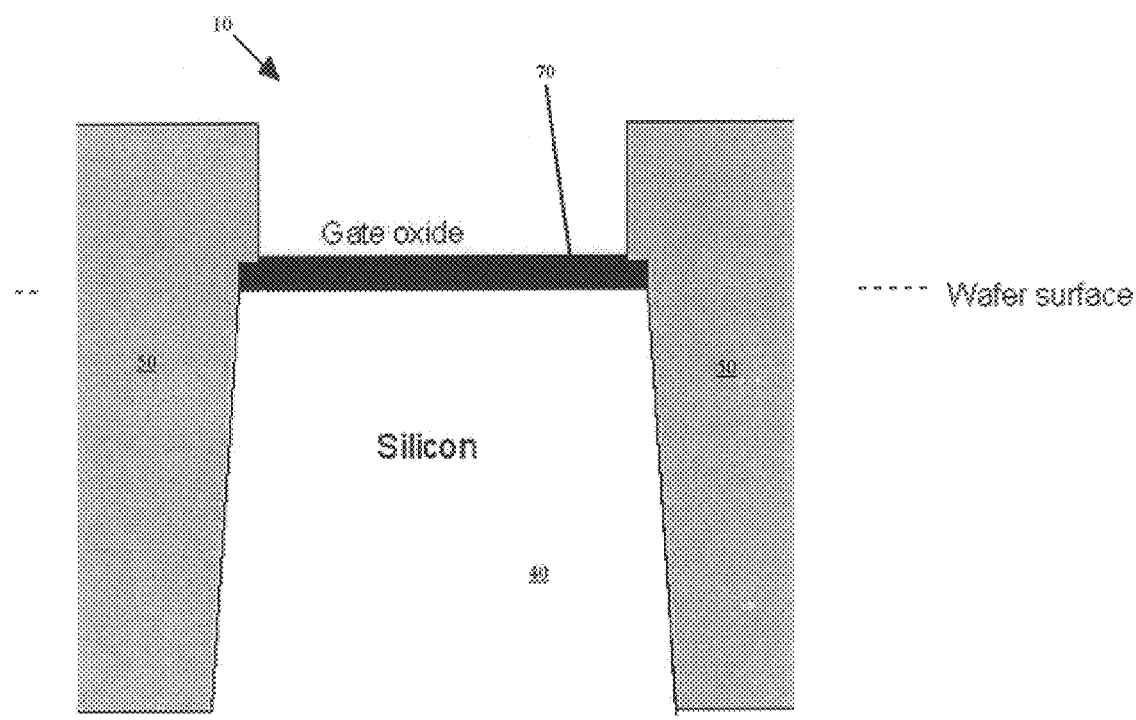

Referring to FIG. 2f, there is shown the final gate oxide 70 that is thermally grown after stripping away of the sacrificial oxide 60. Due to the elimination of the pad oxide strip (see prior art), the result is that the edges of the oxide show no substantial penetration into the surrounding trench fill 50, though there will usually be some detectable, if unsubstantial, lateral widening.

Figure 3:
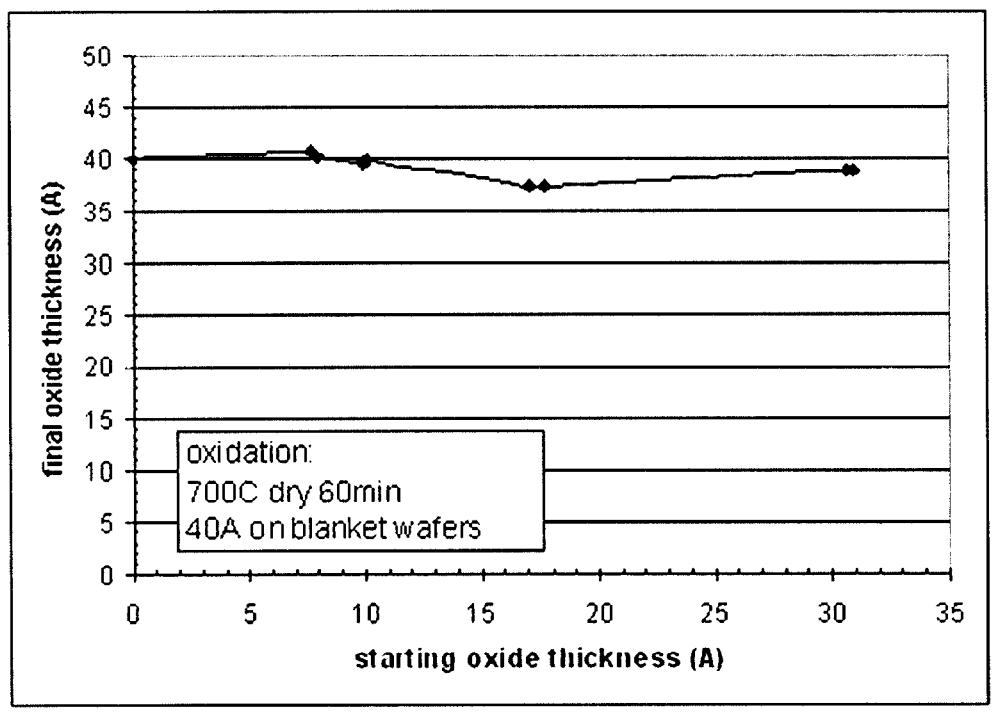
FIG. 3 shows a graph of final sacrificial oxide thickness versus starting pad oxide thickness.

One of the benefits of the method of the invention are shown in FIG. 3, wherein there is shown a graph of final sacrificial oxide thickness versus starting pad oxide thickness. By "starting" oxide thickness is meant the thickness of the pad oxide 20 after the stripping of the pad nitride 30, such as is shown in FIG. 2d. The thickness of the pad oxide after pad nitride strip is dependent on the pad nitride uniformity and pad nitride etch uniformity, it typically shows large variations from wafer to wafer as well as on a wafer from center to edge. By "final" thickness is meant the measured thickness of the pad oxide layer after the thickening step as, now acting as sacrificial oxide 60 shown in FIG. 2e. As can be seen, sacrificial oxide layer 60 thickness is maintained at about forty angstroms regardless of the starting thickness. Initial pad oxide thicknesses ranging from seven to thirty angstroms were used to generate this graph.

The thickening reaction is carried out by simply heating the wafer in a furnace in an atmosphere containing oxygen. Reaction conditions will be from about 500° C. to about 1,000° C. Preferably about 600° C. to about 800° C., or about 700° C. This will result in an amorphous oxide growth Small amounts of water or chlorine may be added to the reaction chamber to accelerate the growth rate. Increasing the chamber pressure will also increase the reaction rate. Generally, however, it is merely necessary to heat the wafer for about one hour at about 700° C. at about one Atmosphere to generate an oxide layer about forty angstroms thick. The actual thickness chosen will be a thickness effective in enabling the use of the oxide layer 60 as a sacrificial oxide for whatever implants, anneals, or other process steps the user has in mind. Generally, the thickness will be from 20 to 100 angstroms, more preferably from about 30 to about 80 angstroms for such purposes, but generally the thickness will be about 40 or 50 angstroms because the rate of reaction begins to fall off substantially at around 50 angstroms, thereby slowing the manufacturing process.

As can be seen, the method of the invention replaces the pad oxide stripping step with an oxidation step and thereby significantly reduces lateral oxide etching of the surrounding trench fill by eliminating an etching step.

It should be noted that the invention may be practiced with any suitable gate dielectric material. In additional to the typical silicon oxide dielectrics shown in the drawings, so-called "high-k" dielectrics may also be utilized, such as, for example, barium strontium titanate (BST), lead zirconate titanate (PZT) and lanthanam-doped PZT (PLZT).

It is to be understood that all physical quantities disclosed herein, unless explicitly indicated otherwise, are not to be construed as exactly equal to the quantity disclosed, but rather as about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of processing a semiconductor gate structure on a semiconductor wafer, the method comprising:

providing a semiconductor structure comprising a semiconductor gate capped with a pad oxide layer bounded by one or more isolation trenches filled with silicon oxide;

providing a sacrificial oxide layer by thickening said pad oxide layer to a thickness effective in using said thickened pad oxide layer as said sacrificial oxide layer, wherein said sacrificial oxide layer comprises amorphous silicon oxide;

stripping said sacrificial pad oxide layer after use; and capping said semiconductor gate with a gate oxide layer.

2. The method of claim 1 wherein said thickening step comprises:

heating said semiconductor wafer in an oxygen-containing atmosphere to a temperature effective in silicon oxide growth.

3. The method of claim 2 wherein said semiconductor wafer is heated to a temperature of from about 500° C. to about 1,000° C.

4. The method of claim 3 wherein said temperature is about 700° C.

5. The method of claim 4 wherein said semiconductor wafer is heated for about one hour.

6. The method of claim 1 wherein said sacrificial oxide layer is from about 20 to about 100 angstroms thick.

7. The method of claim 1 wherein said sacrificial oxide layer is from about 30 to about 50 angstroms thick.

8. The method of claim 1 wherein said sacrificial oxide layer is about 40 angstroms thick.

* * * * *